United States Patent
Lin et al.

(10) Patent No.: US 12,523,929 B2
(45) Date of Patent: Jan. 13, 2026

(54) METHODS FOR REMOVING CATALYST PARTICLES FROM NANOTUBE FILMS

(71) Applicant: Taiwan Semiconductor Manufacturing Company, Hsinchu (TW)

(72) Inventors: Ping-Hsun Lin, New Taipei (TW);
Pei-Cheng Hsu, Taipei (TW);
Huan-Ling Lee, Hsinchu (TW);
Ta-Cheng Lien, Cyonglin (TW);
Hsin-Chang Lee, Zhubei (TW);
Chin-Hsiang Lin, Hsin-chu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 821 days.

(21) Appl. No.: 17/722,457

(22) Filed: Apr. 18, 2022

(65) Prior Publication Data
US 2022/0413378 A1    Dec. 29, 2022

Related U.S. Application Data

(60) Provisional application No. 63/214,575, filed on Jun. 24, 2021.

(51) Int. Cl.
*G03F 1/64*    (2012.01)
*G03F 1/62*    (2012.01)
(Continued)

(52) U.S. Cl.
CPC ............... *G03F 1/64* (2013.01); *G03F 1/62* (2013.01); *G03F 1/82* (2013.01); *G03F 1/84* (2013.01)

(58) Field of Classification Search
CPC ...... G03F 1/62; G03F 1/64; G03F 1/82; G03F 1/84; G03F 7/2002; G03F 8/2004; G03F 7/2008; G03F 7/30; G03F 7/36
See application file for complete search history.

(56) References Cited

U.S. PATENT DOCUMENTS

| | | | |
|---|---|---|---|
| 2012/0238096 A1* | 9/2012 | Xiong | G03F 1/24 257/E21.258 |
| 2016/0033860 A1* | 2/2016 | Wiley | G03F 1/62 430/5 |

(Continued)

FOREIGN PATENT DOCUMENTS

| | | | | |
|---|---|---|---|---|
| JP | 2006010334 A | * | 1/2006 | |
| WO | WO-2013173922 A1 | * | 11/2013 | ............. H01J 45/00 |
| WO | WO-2021037662 A1 | * | 3/2021 | ........... C01B 32/158 |

OTHER PUBLICATIONS

Souza, et al. ("In situ tracking of defect healing and purification of single-wall carbon nanotubes with laser radiation by time-resolved Raman spectroscopy", RSC Advances, 2015, 5, 62149 (Year: 2015).*

(Continued)

*Primary Examiner* — Mark F. Huff
*Assistant Examiner* — Kevin J Drummey
(74) *Attorney, Agent, or Firm* — Lippes Mathias LLP

(57) ABSTRACT

Methods for removing a catalyst particle from a nanotube film used in a photolithographic patterning process are disclosed. The catalyst particle is identified based on its size in the nanotube film. This identification can be done using an inspection device such as a confocal microscope, which permits comparison of images taken in two or more separate focal planes to determine the size of particles. The catalyst particle is then exposed to a first absorption wavelength using a laser, which is selectively absorbed by the catalyst particle and which heats the catalyst particle to remove the catalyst particle from the nanotube film. Optionally, the (Continued)

catalyst particle-free nanotube film can be further exposed to a second absorption wavelength which is selectively absorbed by the film and promotes repair of the film. The resulting nanotube film can be used in a pellicle membrane.

20 Claims, 12 Drawing Sheets

(51) Int. Cl.
*G03F 1/82* (2012.01)
*G03F 1/84* (2012.01)

(56) References Cited

U.S. PATENT DOCUMENTS

| | | | |
|---|---|---|---|
| 2017/0212057 A1* | 7/2017 | Janik | G03F 7/70591 |
| 2018/0329291 A1* | 11/2018 | Timmermans | G03F 1/64 |
| 2019/0129300 A1* | 5/2019 | Ono | H01L 21/0274 |

OTHER PUBLICATIONS

JP2006010334A English Translation (Year: 2024).*

* cited by examiner

METHODS FOR REMOVING CATALYST PARTICLES FROM NANOTUBE FILMS

PRIORITY CLAIM AND CROSS-REFERENCE

This application claims priority to U.S. Provisional Patent Application Ser. No. 63/214,575, filed on Jun. 24, 2021, which is incorporated by reference in its entirety.

BACKGROUND

A photolithographic patterning process uses a reticle (i.e. photomask) that includes a desired mask pattern. The reticle may be a reflective mask or a transmission mask. In the process, ultraviolet light is reflected off the surface of the reticle (for a reflective mask) or transmitted through the reticle (for a transmission mask) to transfer the pattern to a photoresist on a semiconductor wafer. The minimum feature size of the pattern is limited by the light wavelength. Deep ultraviolet (UV) lithography uses a wavelength of 193 nm or 248 nm. Extreme ultraviolet (EUV) light, which spans wavelengths from 124 nanometers (nm) down to 10 nm, is currently being used to provide small minimum feature sizes. At such short wavelengths, particle contaminants on the photomask can cause defects in the transferred pattern. The present disclosure relates to improving pellicle membranes used to minimize the effects of such particles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is a first diagram, FIG. 7B is a second diagram, FIG. 7C is a third diagram, and FIG. 7D is a fourth diagram.

FIG. 10A is a first diagram, FIG. 10B is a second diagram, and FIG. 10C is a third diagram.

FIG. 11A is a first diagram, FIG. 11B is a second diagram, FIG. 11C is a third diagram, and FIG. 11D is a fourth diagram.

DETAILED DESCRIPTION

Figure 1:
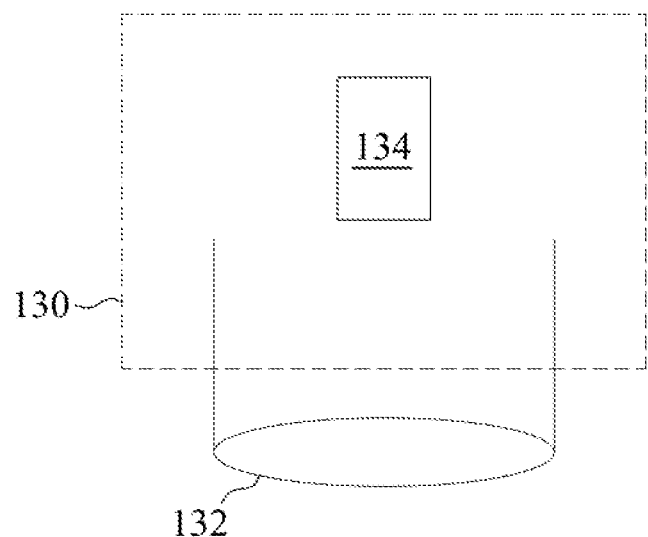
FIG. 1 is a schematic diagram illustrating one embodiment of a system for practicing the methods of the present disclosure, in accordance with some embodiments.
Figure 1:
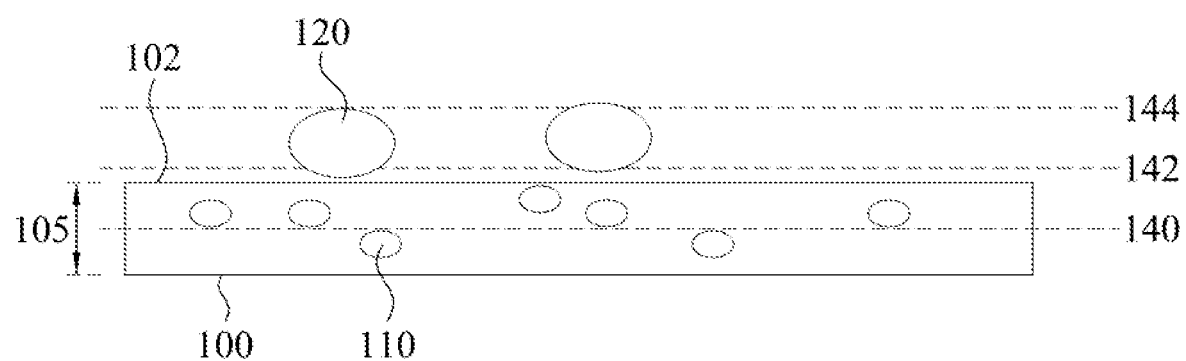

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure may refer to temperatures for certain method steps. It is noted that these references are usually to the temperature at which the heat source is set, and do not specifically refer to the temperature which must be attained by a particular material being exposed to the heat.

The present disclosure refers to "orders of magnitude," which are determined in base 10. Two numbers are of the same order of magnitude if the quotient of the larger number divided by the smaller number is at least 1 (i.e. $10^0$) and less than 10 (i.e. $10^1$). Two numbers differ by one order of magnitude if the quotient of the larger number divided by the smaller number is at least 10 (i.e. $10^1$) and less than 100 (i.e. $10^2$). Two numbers differ by two orders of magnitude if the quotient of the larger number divided by the smaller number is at least 100 (i.e. 10^2) and less than 1000 (i.e. 10^3).

The term "plane" is used herein in its lay sense of a flat surface generally having a very small thickness. This term should not be interpreted in the strict mathematical definition of a two-dimensional surface extending infinitely in each dimension.

The term "average particle size" refers to the diameter of a spherical particle. For non-spherical particles, this term refers to the diameter of a spherical particle that has the same volume as the non-spherical particle.

As previously mentioned, photolithographic patterning processes use a reticle (i.e. photomask) that includes a desired mask pattern, which is transferred to a semiconducting wafer substrate using light. Extreme ultraviolet (EUV) light, which spans wavelengths from 124 nanometers (nm) down to 10 nm, is currently being used to provide even smaller minimum feature size. At shorter wavelengths, particle contaminants on the reticle can cause defects in the transferred pattern. Thus, a pellicle assembly (or simply pellicle) is used to protect the reticle from such particles. The pellicle assembly includes a pellicle membrane which is attached to a mounting frame. The mounting frame supports the pellicle membrane over the reticle. Any contaminating particles which land on the pellicle membrane are thus kept out of the focal plane of the reticle, thus reducing or preventing defects in the transferred pattern.

The present disclosure thus relates to pellicle assemblies and methods for preparing pellicle membranes for use in such assemblies, and for use in photolithographic printing or patterning processes. In particular, the pellicle membranes contain at least one film or layer made from nanotubes. The present disclosure also relates to methods for processing such nanotube films/layers to enhance them and to simplify subsequent inspection and certification processes.

In this regard, nanotubes are usually made in processes that include a catalyst. As one non-limiting example, carbon nanotubes are produced using iron as a catalyst. During production of the nanotube film, catalyst particles can become embedded in the film. The presence of the catalyst particles in the resulting nanotube film creates difficulties during inspection of pellicle membranes and pellicle assemblies that include the nanotube film/layer. This is because it is difficult to distinguish between the catalyst particles and larger removable contaminant particles using conventional inspection methods. This reduces the suitability of the nanotube film for products and processes that require extreme cleanliness, such as when the nanotube film is used for a pellicle membrane (since it is undesirable to have large contaminant particles fall onto the reticle).

FIG. 1 is a schematic diagram illustrating one embodiment of a system for practicing the methods of the present disclosure. A nanotube film 100 is illustrated here, with catalyst particles 110 embedded within the nanotube film. Also included are other contaminant particles 120, which are present on the surface 102 of the nanotube film. Also illustrated is an inspection device 130, which is illustrated here as a confocal microscope including an objective lens 132. The use of a confocal microscope increases optical resolution and contrast for the given focal plane of the confocal microscope. Finally, the inspection device includes at least one laser source 134. As will be explained further, it may be desirable for the inspection device to produce two or three different light wavelengths for different purposes. This can be done using a laser whose emission wavelength can be adjusted, or by using multiple laser sources.

It should be noted that catalyst particles are usually much smaller in size than the contaminant particles. In particular embodiments of the present disclosure, the catalyst particles typically have an average particle size of at most 100 nanometers (although they may be longer). In contrast, the contaminant particles typically have an average particle size of 1 micrometer (i.e. 1000 nm) or longer (although they may be shorter). Generally speaking, catalyst particles may be smaller than contaminant particles (as measured by average particle size) by at least one order of magnitude, or by at least two orders of magnitude.

The nanotube film 100 has a generally uniform thickness 105. In accordance with various embodiments of the present disclosure, the thickness is about 200 nm or less, including from about 10 nanometers (nm) to about 100 nm. With respect to the inspection device/confocal microscope, the nanotube film may be considered as falling within a plane, also referred to herein as a first focal plane (reference numeral 140), due to the depth of field of the microscope, which is usually greater than the thickness of the nanotube film.

Also illustrated is a second focal plane 142 and a third focal plane 144, which are located outside of the plane 140 of the nanotube film. As illustrated here, both of these focal planes are located above the plane of the nanotube film, with the third focal plane 144 being located further away from the plane 140 of the nanotube film than the second focal plane 142. The distance between the three focal planes is about the same.

Figure 2:
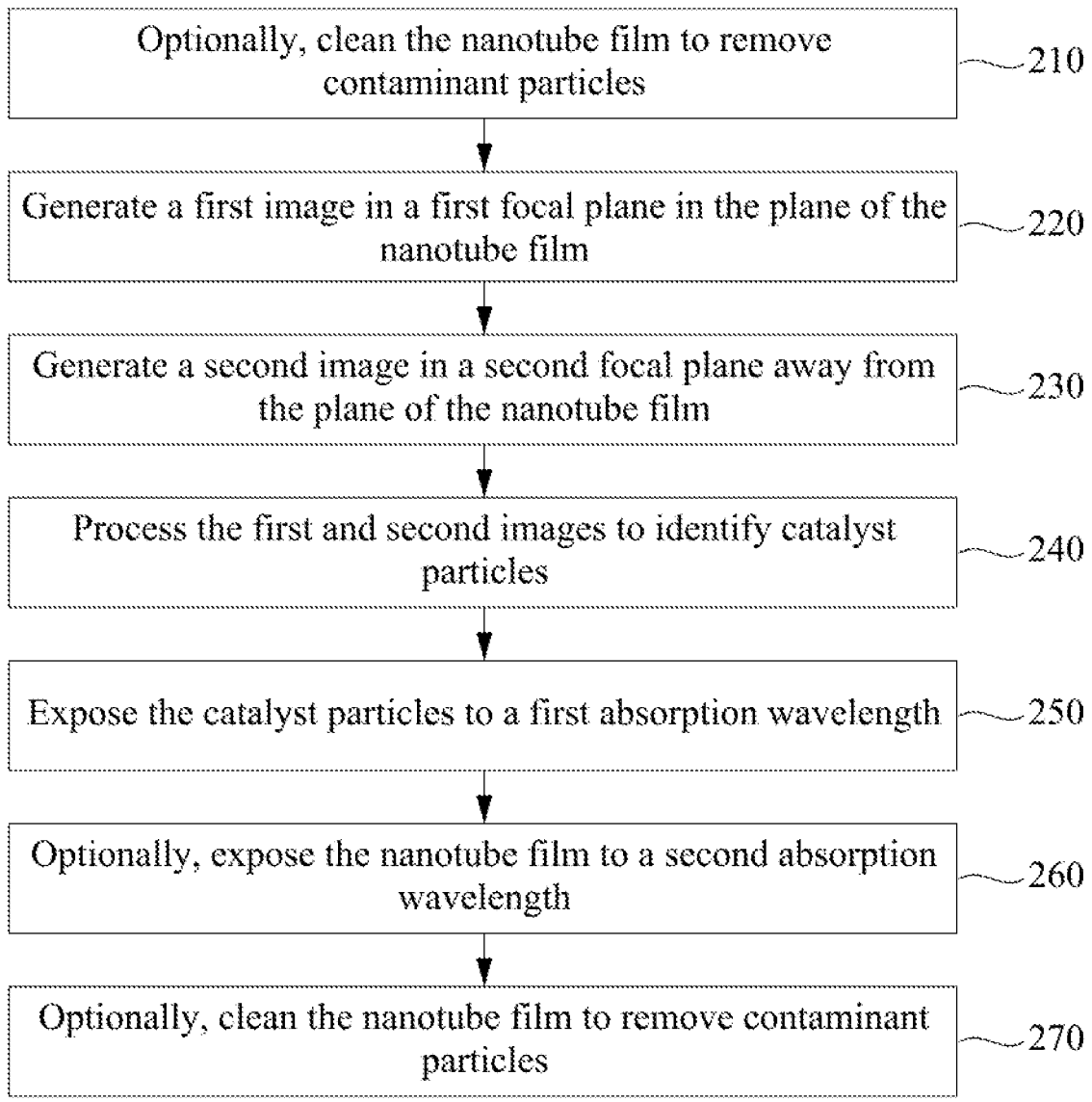
FIG. 2 is a flow chart illustrating a first method for identifying a catalyst particle and/or its location within a nanotube film, and subsequently removing the catalyst particle from the nanotube film, according to some embodiments of the present disclosure.

FIG. 2 is a flow chart illustrating a first method for identifying a catalyst particle and/or its location within a nanotube film, and subsequently removing the catalyst particle from the nanotube film, according to some embodiments of the present disclosure. In this method, the inspection device (i.e. confocal microscope) is used to capture multiple two-dimensional images at different depths, labeled here as the different focal planes 140, 142, 144. Combining these images permits the identification of three-dimensional structures, such as the catalyst particles and the contaminant particles, as well as a determination of their particle size and their location within the image and the nanotube film. This method is also explained with reference to FIG. 1.

In optional step 210, the nanotube film is first cleaned to remove any easily removable contaminant particles from the film. This cleaning may be performed using conventional processes such as rinsing/washing using deionized water or other solvents; thermal treatment (i.e. annealing); plasma treatment; or gentle suction or air blowing. The contaminant particles themselves may be materials generated during other fabrication processes such as sputtering, etching, metallization, etc. Examples of such materials may include silicon, metals such as aluminum or copper, solvents, surfactants, etc.

Next, in step 220, a first image is generated in a first focal plane, which is in the plane 140 of the nanotube film. In step 230, a second image is generated in a second focal plane, which is away from or outside of the plane of the nanotube film.

The images may be generated using the inspection device 130, which in some particular embodiments is a confocal microscope or other scanning microscope. Generally, a confocal microscope uses point illumination and/or a pinhole in front of a sensitive detector to eliminate out-of-focus signal, so that only light very close to the point in the focal plane can be detected, increasing optical resolution. The microscope is then scanned over the nanotube film. Software is used to generate the image in the given focal plane. The depth of field can be affected by the wavelength of the light used for imaging and the numerical aperture of the objective lens.

The second focal plane of step 230 may be either focal plane 142, 144 illustrated in FIG. 1. In particular embodiments, the first focal plane and the second focal plane are separated from each other by at least 0.5 micrometers (i.e. 500 nm), which is greater than the particle size of the catalyst particle. Generally, the focal planes should be separated from each other by no more than 10 micrometers. It is noted that the second focal plane can be either above or below the plane of the nanotube film. The first image and the second image can be generated using light having an imaging wavelength, which can be of any appropriate wavelength that provides a depth of field which is less than the distance between the two focal planes.

Continuing with FIG. 2, in step 240, the first image and the second image are processed to identify a catalyst particle. This can be done, for example, by comparing the two images to each other. A catalyst particle can be identified based on its presence in a given location in the first image and its absence from the given location in the second image. Similarly, a contaminant particle can be identified by its presence in a given location in both the first image and the second image.

Generally, the images of only two focal planes are necessary to distinguish catalyst particles from contaminant particles, so long as the two focal planes are separated by a distance greater than the particle size of the catalyst particle. The use of additional images taken from additional focal planes can provide greater resolution of the particle size, which may be useful in other applications.

Continuing, in step 250, the catalyst particle(s) identified in the nanotube film are exposed to a first absorption wavelength. The first absorption wavelength is chosen to be selectively absorbed by the catalyst particle. This absorption heats the catalyst particle, removing the catalyst particle from the nanotube film. The catalyst particle, which is in a solid state, can be converted to its liquid state or gaseous state, and thus leave the nanotube film. In particular embodiments, a laser is used to expose the catalyst particle to the first absorption wavelength, since the location of the catalyst particle is known and the laser can provide higher intensity and better efficiency.

According to some embodiments of the present disclosure, the absorption ratio of the first absorption wavelength (catalyst particle divided by the nanotube film) is greater than 1, or else it would not be selectively absorbed by the catalyst particle. In some further embodiments, the absorption ratio may be greater than 3.

In particular embodiments of the present disclosure, the first absorption wavelength is from about 300 nm to about 700 nm. Within this range, for example, many different wavelengths can be found which are selectively absorbed by iron (which is a catalyst used in making carbon nanotubes). In this regard, it is noted that iron has a melting point of 1538° C. and a boiling point of 2862° C., whereas carbon nanotubes have a melting point of about 3200° C.

Continuing, in optional step 260, the nanotube film is exposed to a second absorption wavelength. More specifically, the area of the nanotube film around the now-removed catalyst particle is exposed. The second absorption wavelength is chosen to be selectively absorbed by the nanotube film. It is contemplated that the removal of the catalyst particle may cause damage to the nanotube film, for example by breaking covalent bonds or leaving a hole in the area around the catalyst particle. The second absorption wavelength provides energy to the nanotube film and promotes repair of the nanotube film. For example, covalent bonds may be broken and reformed to increase the strength of the nanotube film. According to some embodiments of the present disclosure, the absorption ratio of the second absorption wavelength (catalyst particle divided by the nanotube film) is less than 1, indicating selective absorption by the nanotube film compared to the catalyst particle. It is noted that the first absorption wavelength and the second absorption wavelength are different from each other. In some particular embodiments, the second absorption wavelength is from about 200 nm to about 300 nm.

Continuing, in optional step 270, the nanotube film is cleaned to remove any additional removable contaminant particles from the film. In this regard, some contaminant particles may have previously been tightly bound to the nanotube film, but are now removable due to the applied forces of the previous method steps. It should be noted that while cleaning steps 210 and 270 are labeled as being optional, in practice, at least one of these additional steps is performed.

Figure 3:
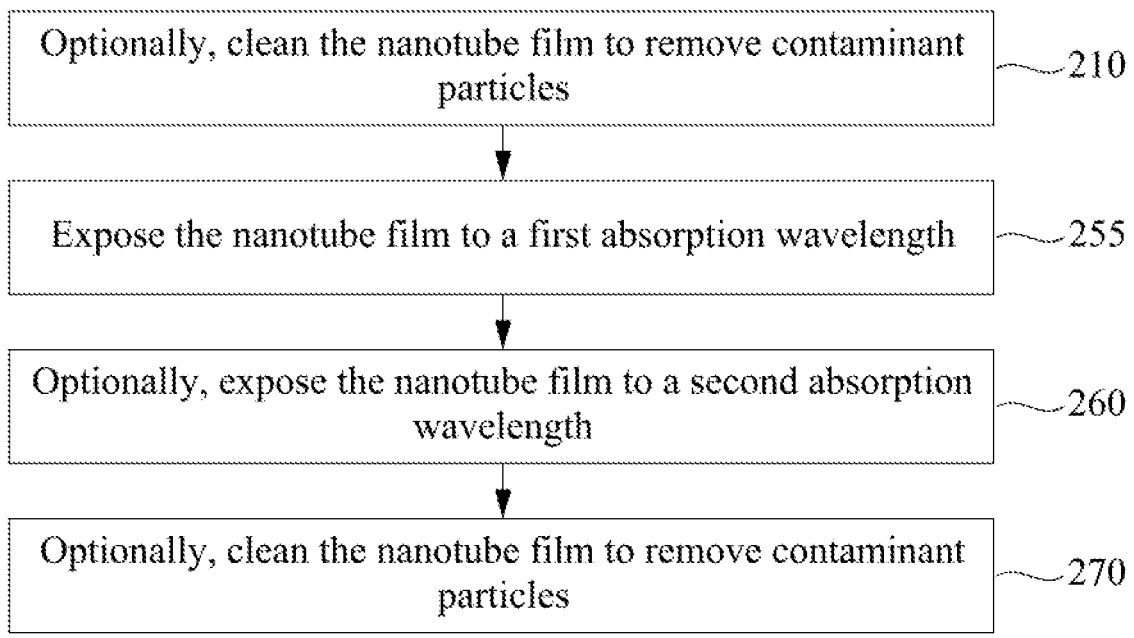
FIG. 3 is a flow chart illustrating a second method for removing one or more catalyst particles from the nanotube film, according to some embodiments of the present disclosure.

FIG. 3 is a flow chart illustrating a second method for removing one or more catalyst particles from the nanotube film, according to some embodiments of the present disclosure. This second method includes optional cleaning step 210, new step 255 in which the nanotube film is exposed to a first absorption wavelength, optional step 260 in which the nanotube film is exposed to a second absorption wavelength, and optional cleaning step 270.

In step 255, it is contemplated that the entire nanotube film is exposed to the first absorption wavelength, rather than selectively exposing the catalyst particles as in FIG. 2. This could be done, for example, by using a lamp which illuminates a wide area. In this situation, then, there would be no need to identify the locations of the catalyst particles beforehand. Compared to step 250 of FIG. 2, the use of a lamp is likely to require higher intensity light and potentially longer exposure times.

The nanotube films which are processed according to the present disclosure can be made from, for example, carbon nanotubes (CNTs) or boron nitride nanotubes (BNNTs) or silicon carbide nanotubes (SiCNTs) or molybdenum disulfide nanotubes ($MoS_2NTs$) or molybdenum diselenide ($MoSe_2NTs$) or tungsten disulfide nanotubes ($WS_2NTs$) or tungsten diselenide nanotubes ($WSe_2NTs$). In some embodiments, the nanotubes can be single-wall nanotubes or multi-wall nanotubes. It is possible for multi-wall nanotubes to be made of different materials, for example a CNT inside a BNNT, or vice versa. In some embodiments, the nanotubes can be metallic or semiconducting or electrically insulating. The length and diameter of the individual nanotubes is not significant, although generally longer nanotubes are more desirable. Generally, the nanotubes of the nanotube film can be randomly oriented or can be directionally oriented in a desired direction.

The nanotubes may be selected based on their properties. For example, carbon nanotubes can have a Young's modulus of about 1.33 TPa; a maximum tensile strength of about 100 GPa; thermal conductivity of about 3,000 to about 40,000 W/mK; and be stable up to a temperature of about 400° C. in air. Boron nitride nanotubes can have a Young's modulus of about 1.18 TPa; a maximum tensile strength of about 30 GPa; thermal conductivity of about 3000 W/mK; and be stable up to a temperature of about 800° C. in air.

Figure 4:
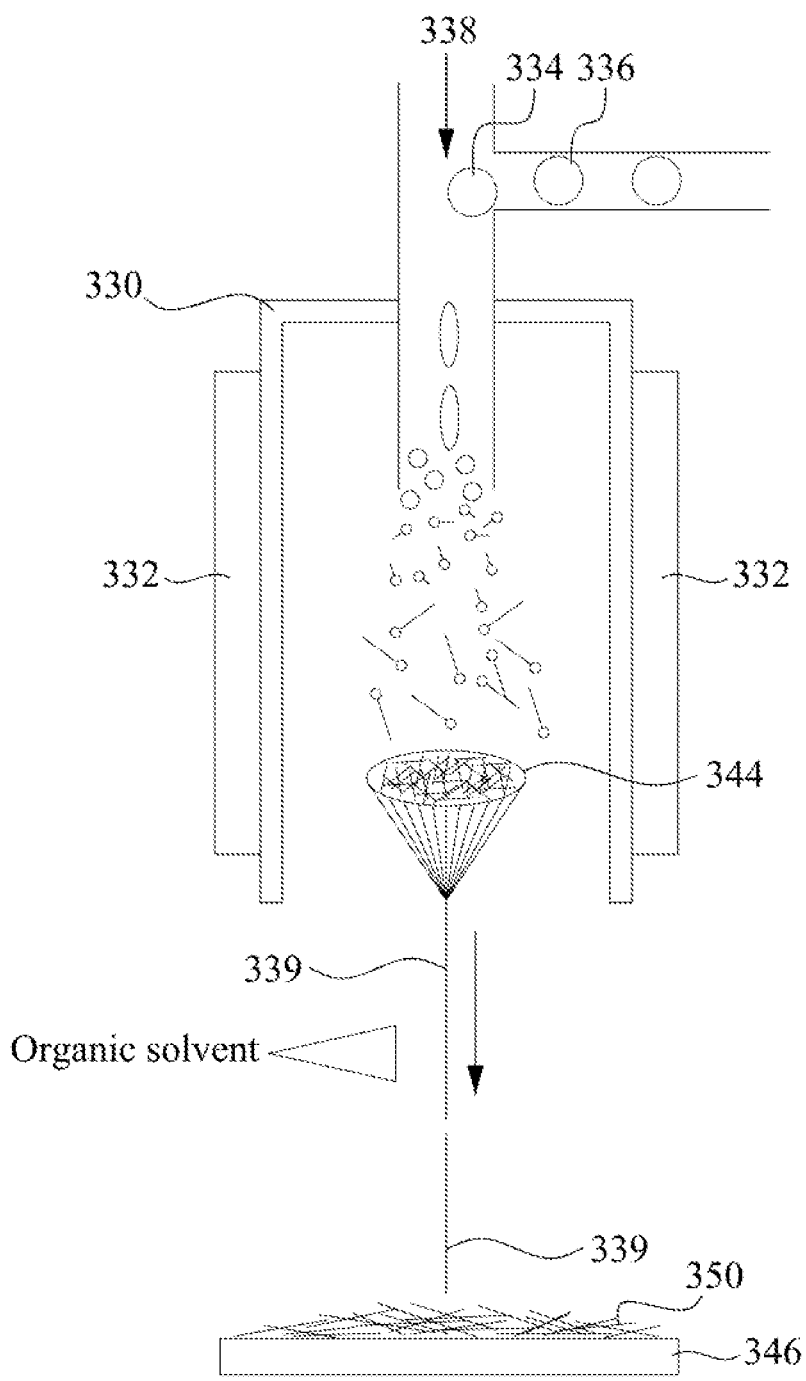
FIG. 4 is a drawing illustrating one embodiment for producing nanotubes, in some embodiments of the present disclosure.

FIG. 4 is a drawing illustrating a reaction vessel 330 which can be used to produce nanotubes, in some embodiments of the present disclosure. In this drawing, the production of carbon nanotubes and a nanotube membrane is illustrated. The reaction vessel 330 includes a heat source 332 for heating materials passing through the reaction vessel. Reactants 334, catalyst 336, and carrier gas 338 enter the reaction vessel. Nucleation, growth, and aggregation of nanotubes in the form of an aerogel 344 occur, and the aerogel is then spun into fibers 339. In some embodiments, this process occurs at temperatures of about 1100° C. to about 1300° C. This can result in the nanotubes being directionally oriented (i.e., oriented in the same direction). An organic solvent is used for densification of the fibers. In some embodiments, the organic solvent can be acetone or an alcohol such as isopropyl alcohol. The fibers 339 are then deposited onto a treated filter paper or polymer 346. Sucking pressure is applied to the treated filter paper 346, and the treated filter paper 346 is rotated to ensure uniform fiber dispersion and obtain to form an initial nanotube membrane 350. Generally, catalysts used for production of different nanotubes using various methods may include iron, sulfur, platinum, nickel, cobalt, and other transition metals.

The nanotube films, and especially carbon nanotube films, with reduced catalytic particle content, can be used to make pellicle membranes for use with reticles. In some embodiments, the pellicle membrane is a single-layer structure. In other embodiments, the pellicle membrane is a multi-layer structure. In some embodiments, the layers of the multi-layer structure can be made of the same materials, and in other embodiments the layers of the multi-layer structure can be made of different materials selected for particular purposes and arranged in order as desired. For example, in some embodiments, the pellicle membrane may comprise one or more nanotube membrane layers and one or more graphene membrane layers.

The pellicle membrane can be attached to a border or a mounting frame for mounting to the reticle. In some embodiments, a conformal coating is then applied to the outer surface of the pellicle membrane (which can be a single layer or a multi-layer structure). When a coating is applied, a border that is subsequently attached to a mounting frame is desirably used. The resulting pellicle assembly can then be mounted onto a reticle.

A combination of several low-density membrane layers can be used to obtain a pellicle membrane that has a combination of high transmittance, small pore size and a stiffness which minimizes any potential deflection.

Figure 5:
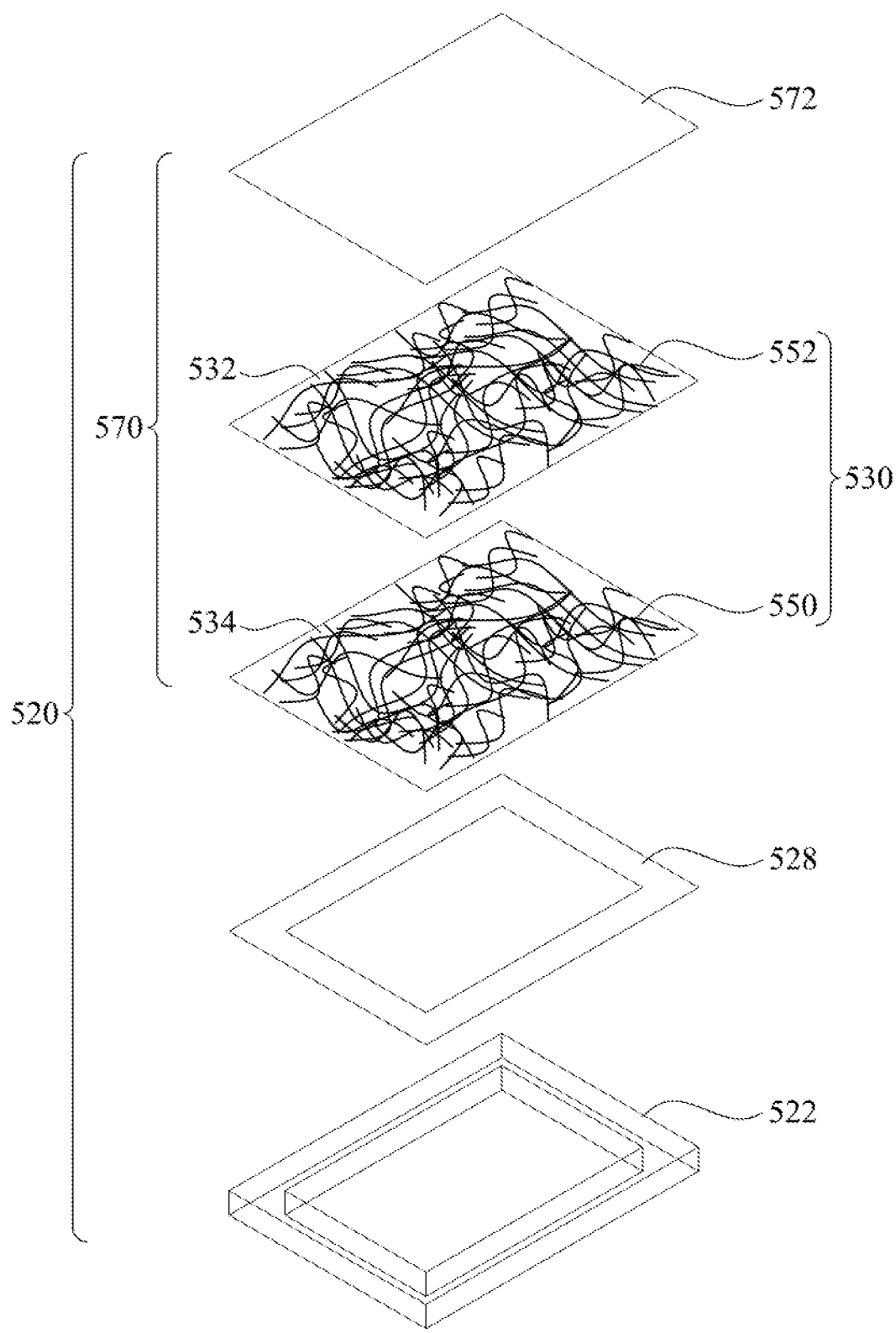
FIG. 5 is an exploded view of a first embodiment of a pellicle membrane, pellicle membrane assembly, and pellicle assembly in accordance with some embodiments.

FIG. 5 is an example embodiment of a pellicle membrane 530, pellicle membrane assembly 570, and pellicle assembly 520 according to the present disclosure which can include a nanotube film prepared according to the methods of the present disclosure. In this example embodiment, a conformal coating is present.

In this figure, the pellicle membrane 530 is a multi-layer structure formed from a first nanotube film 550 and a second nanotube film 552. As illustrated here, the first nanotube film 550 and the second nanotube film 552 are formed from randomly oriented nanotubes, and the two layers contact each other. In some embodiments, each nanotube film has a thickness of about 10 nm to about 100 nm.

Here, the second nanotube film is also considered the outer surface 532 of the pellicle membrane, to which a conformal coating is applied. The conformal coating may be considered to form the outermost layer 572 of the pellicle membrane. In some embodiments, the outermost layer has a thickness of about 1 nanometer (nm) to about 10 nm. The first nanotube film is also considered the inner surface 534 of the pellicle membrane and is attached to a border 528. The border runs along the perimeter of the pellicle membrane. The border is also attached to a mounting frame 522.

The combination of the outermost layer/conformal coating 572 and the pellicle membrane 530 together is referred to as a pellicle membrane assembly 570 herein. The combination of the pellicle membrane assembly 570, border 528, and mounting frame 522 is referred to herein as a pellicle assembly 520.

Referring back to the example production method shown in FIG. 4, the initial nanotube membrane 350 generally has a relatively large thickness of, for example, about 700 nm to about 10 micrometers (µm). The methods of FIG. 2 and FIG. 3 may be more advantageously practiced on nanotube films or layers having a reduced thickness, since a reduced thickness brings the catalyst particles closer to the surface for exposure to the first absorption wavelength and subsequent removal from the nanotube membrane, film, or layer. FIG. 6 and FIGS. 7A-7D illustrate two examples of methods that can be used to reduce the thickness and obtain a nanotube film or layer.

Figure 6:
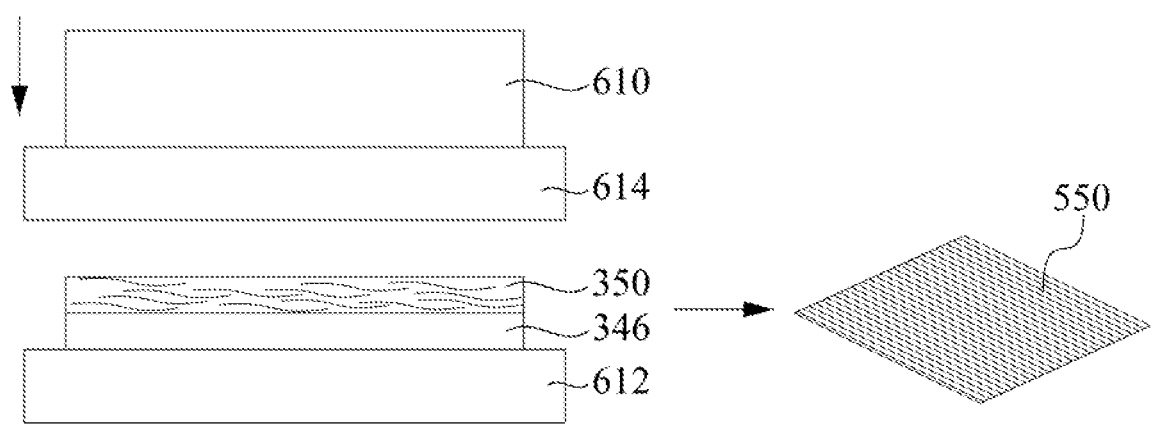
FIG. 6 is a diagram illustrating one method for reducing the thickness of an initial nanotube membrane to obtain a nanotube film, in accordance with some embodiments.

In FIG. 6, the initial nanotube membrane of FIG. 4 is processed to reduce its thickness and obtain the nanotube film. As illustrated here, the initial nanotube membrane 350 is supported by a surface 346, which is placed within a pressing machine 610, which comprises a bolster plate 612 and a ram 614. The initial nanotube membrane 350 is compressed between the bolster plate 612 and the ram 614 to obtain the nanotube film 550.

FIGS. 7A-7D depicts a second example process for producing a nanotube film from a thicker initial membrane 350. Briefly, the initial membrane is stretched to reduce its thickness and obtain the nanotube film. In addition, in this second example process, the nanotube film is attached to a mounting frame.

Figure 7B:
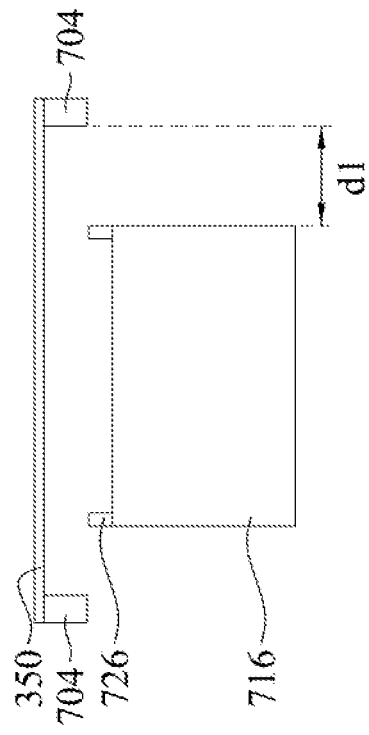
FIGS. 7A-7D are a set of side cross-sectional diagrams illustrating a second example process for reducing the thickness of an initial nanotube membrane to obtain a nanotube film, in accordance with some embodiments.
Figure 7D:
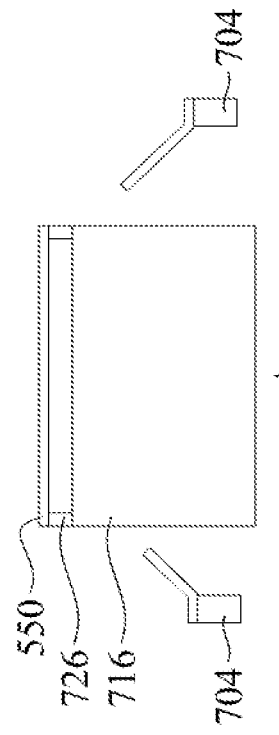
Figure 7A:
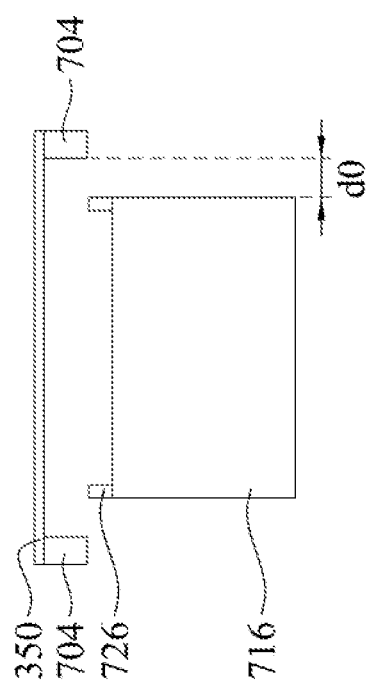

Starting with FIG. 7A, the initial membrane 350 is attached to a stretching frame 704. A piston 716 is illustrated here for reference. The distance d0 represents the starting position of the mounting frame 704 and membrane 350 assembly before stretching, relative to piston 716. Also mounted to the head of the piston is a mounting frame 726. At this point, the mounting frame 726 does not contact the membrane 350.

Next, in FIG. 7B, the membrane 350 is stretched by the mounting frame 704 along the x-axis and/or y-axis. This is indicated by distance d1, which is greater than distance d0. This stretching will also reduce the thickness of the membrane. The mounting frame 726 still does not contact the membrane 350.

Figure 7C:
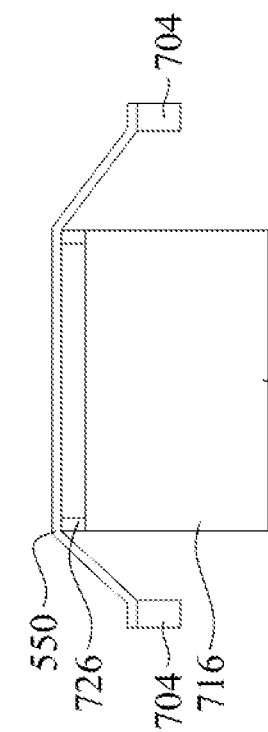

Moving to FIG. 7C, the piston 716 now moves upwards in the z-axis, so that the mounting frame 726 is affixed to the nanotube film 550, for example via van der Waals forces, to obtain the nanotube film 550. The movement in the z-axis will impart shear forces to the nanotube film, which will cause some additional stretching of the nanotube film, although the majority of the stretching occurs in the x-axis and/or y-axis.

Lastly, as depicted in FIG. 7D, the mounting frame 726 and a portion of the nanotube film 550 is cut out and separated from the stretching frame 704 and the remainder of the nanotube film. A pellicle assembly (still mounted to the piston) is the result.

In this regard, it should be noted that the methods of FIG. 2 and FIG. 3 for removing catalyst particles from the nanotube film can be practiced either prior to attaching the nanotube film to a mounting frame, or after the nanotube film has been attached to a mounting frame. Referring to FIG. 7D, the mounting frame is only attached to one surface of the nanotube film, and so exposure to the first absorption wavelength can occur from the opposite surface.

Figure 8:
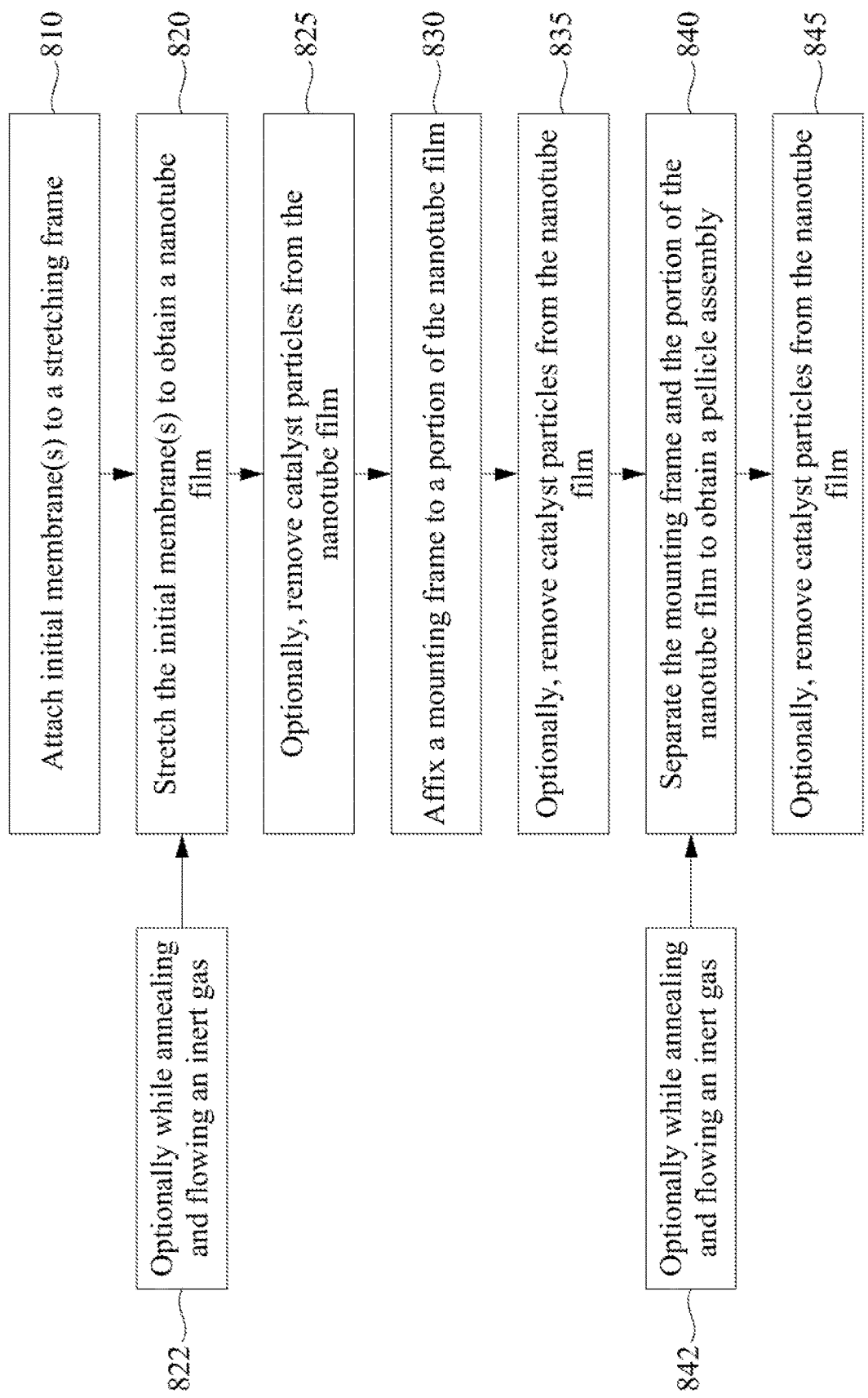
FIG. 8 is a flow chart illustrating one embodiment of a method for preparing a pellicle assembly with a single-layer pellicle membrane, in accordance with some embodiments.

FIG. 8 is thus a flow chart illustrating one embodiment of a method for preparing a pellicle assembly, as illustrated in FIGS. 7A-7D. This method is applicable to single-layer or multi-layer membranes formed from nanotubes. In step 810, one or more initial membranes is/are attached to a stretching frame. This is illustrated in FIG. 7A. In step 820, the initial membrane(s) is/are stretched to reduce the thickness of the initial membrane and obtain the nanotube film. For example, the initial membrane(s) can be uniaxially, biaxially, or triaxially stretched. This is illustrated in FIG. 7B and FIG. 7C. In some embodiments, the initial membrane(s) is/are annealed during the stretching. The initial membrane(s) can be annealed at a temperature of about 200° C. to about 800° C. In other embodiments, the initial membrane(s) is/are heated at a temperature of about 200° C. to about 500° C. In some additional embodiments, the stretching is performed while an inert gas is flowed past or through the initial membrane(s). In some embodiments, the inert gas is pure nitrogen gas ($N_2$). These optional steps are indicated in step 822.

In step 830, a mounting frame is affixed to a portion of the nanotube film. The mounting frame has smaller dimensions (in length, or in width, or in both length and width) than the nanotube film, and thus surrounds a portion of the nanotube film. This is also illustrated in FIG. 7C. In step 840, the mounting frame and the portion of the nanotube film are then separated from the remainder of the nanotube film to obtain the pellicle assembly. This can be done, for example, by cutting or other similar means. This is also illustrated in FIG. 7D. If desired, the annealing and/or inert gas flow can be maintained during these affixing and separating steps (i.e. either one or both of the annealing and inert gas flow), as indicated in step 842. The portion of the nanotube film which is surrounded by the mounting frame can be considered the pellicle membrane. In this method, the initial membrane has a higher density than the final pellicle membrane. The final pellicle membrane is also thinner than the initial membrane(s). The resulting pellicle assembly can again then be attached to a reticle by securing the frame to the mask, with the pellicle membrane disposed over the mask pattern, to produce a final reticle with pellicle assembly.

Continuing, the catalyst particles are removed from the nanotube film using the methods described in FIG. 2 or FIG. 3. As shown here, this can be done as step 825 after the stretching 820 but prior to affixing the mounting frame 830. Alternatively, this can be done as step 835 after the mounting frame is affixed, or as step 845 after the pellicle assembly has been formed.

Figure 9:
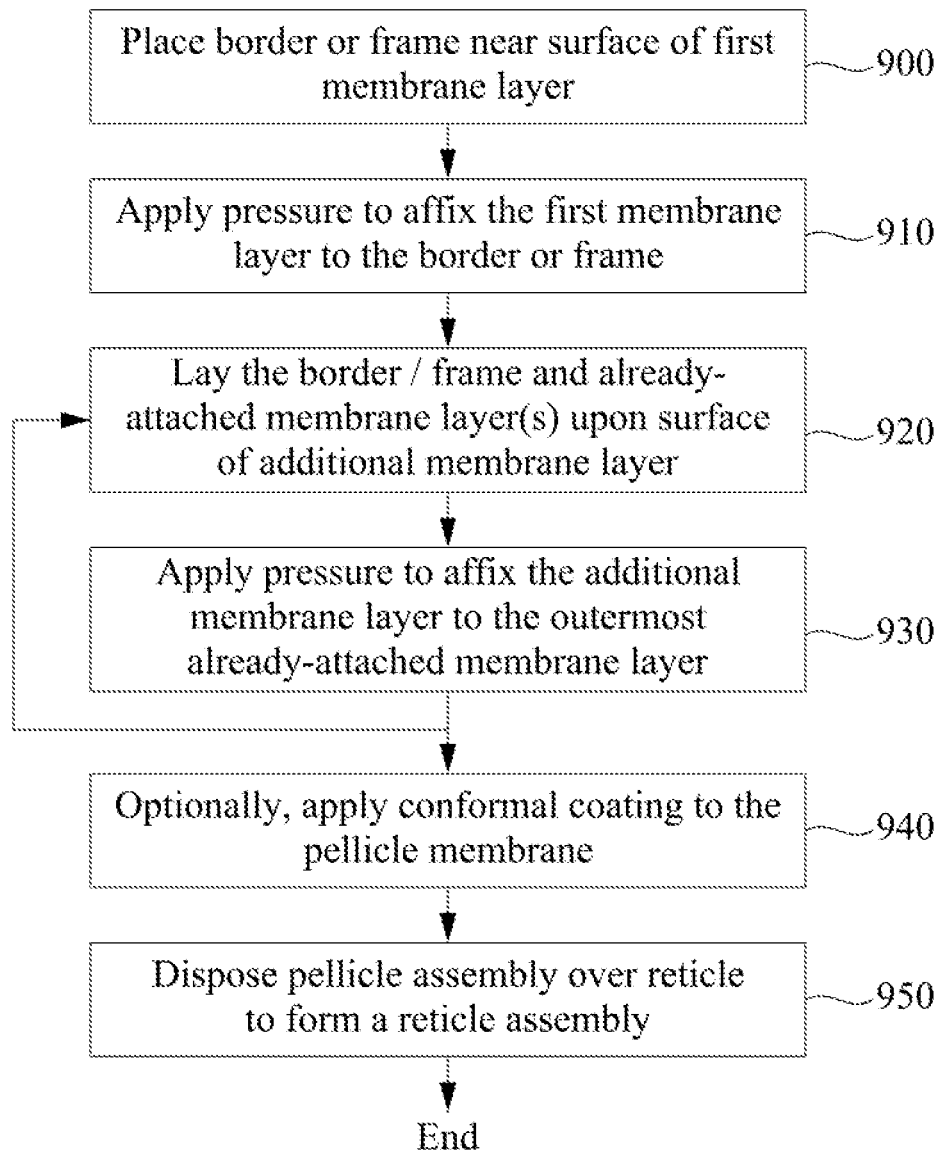
FIG. 9 is a flow chart illustrating one embodiment of a method for preparing a pellicle assembly with a multi-layer pellicle membrane, in accordance with some embodiments.

FIG. 9 is a flow chart illustrating another embodiment of a method for preparing a pellicle assembly and a reticle assembly. Here, the pellicle membrane is formed from a multi-layer structure. Very generally, in step 900, a border or mounting frame is placed adjacent to a surface of a first nanotube film layer. Next, in step 910, pressure is applied to affix the first nanotube film layer to the border/frame. The first nanotube film layer and the border/frame remain attached via Van der Waals forces. If it is desired to make the pellicle membrane from more than one layer, then in step 920, the border/frame and any already-attached nanotube film layer(s) are laid upon a surface of the additional nanotube film layer. The outermost already-attached nanotube film layer contacts the surface of the additional nanotube film layer. Next, in step 930, pressure is applied again to affix the additional nanotube film layer to the already-attached nanotube film layer(s). Steps 920 and 930 can be repeated with additional nanotube film layers until the desired multi-layer structure of the pellicle membrane is assembled, and a pellicle assembly is obtained. In optional step 940, the conformal coating is applied to the pellicle membrane. Finally, in step 950, the pellicle assembly is disposed over a mask pattern on a reticle to form a reticle assembly.

Figure 10A:
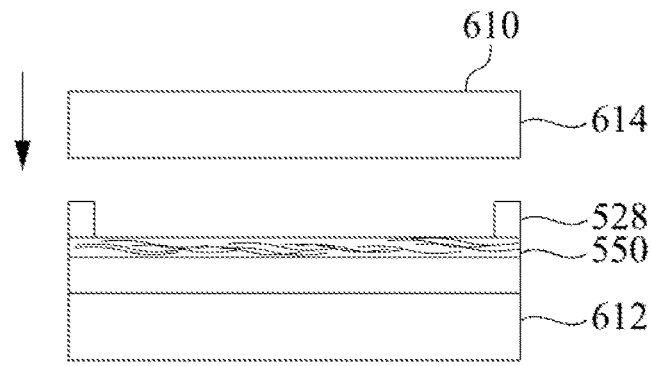
FIGS. 10A-10C are a set of diagrams illustrating the method of FIG. 9, in accordance with some embodiments.
Figure 10B:
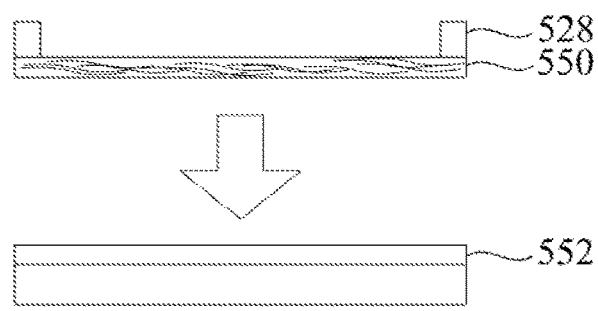
Figure 10C:
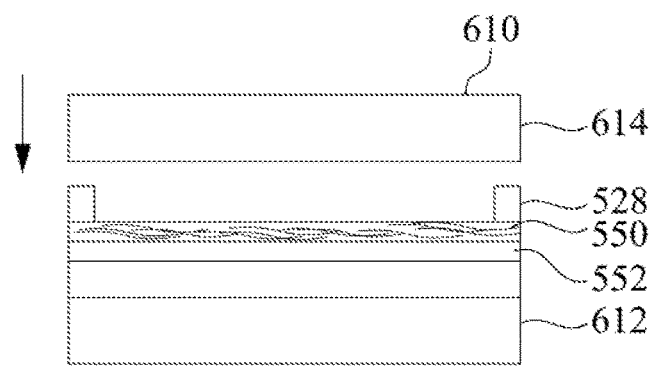

FIGS. 10A-10C are a set of drawings illustrating some steps of the method of FIG. 9, in one embodiment. In FIG. 10A, a first nanotube film layer 550 is affixed to the border 528 through pressure applied by a pressing machine 610 comprising a bolster plate 612 and a ram 614. In FIG. 10B, the border 528 and first nanotube film layer 550 (already attached to the border 528) are then laid upon a second nanotube film layer 552. In FIG. 10C, pressure is again applied through the pressing machine 610 to attach the second nanotube film layer 552 to the first nanotube film layer 550. A multi-layer pellicle membrane can thus be built up successively. It is noted that the thickness of the multi-layer pellicle membrane might vary slightly between the center of the pellicle membrane and the edges of the pellicle membrane where pressure has been used to attach the layers to the border.

While FIG. 2 and FIG. 3 describe the removal of catalyst particles from the nanotube film prior to the nanotube film being incorporated into a multi-layer pellicle membrane, it is noted that these methods can also be used to remove catalyst particles after the nanotube film has been assembled into a multi-layer pellicle membrane. In such situations, the first absorption wavelength and the second absorption wavelength should be chosen with additional consideration of the impact of exposure to such wavelengths by the other layers of the pellicle membrane.

It is also noted while the above discussion refers to removing catalyst particles, the methods can also be used more generally to identify other types of contaminating particles, and to remove those contaminating particles as well.

Figure 11A:
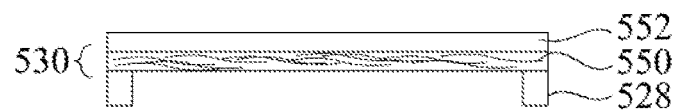
FIGS. 11A-11D are a set of diagrams illustrating a method for coating an outer surface of a pellicle membrane, in accordance with some embodiments.
Figure 11B:
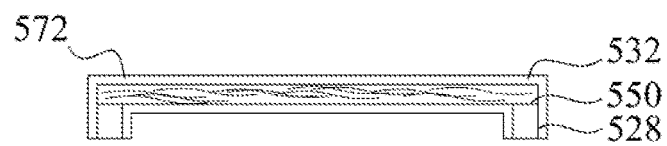
Figure 11C:
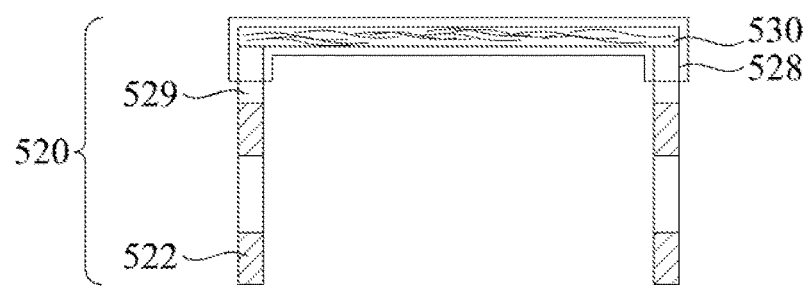
Figure 11D:
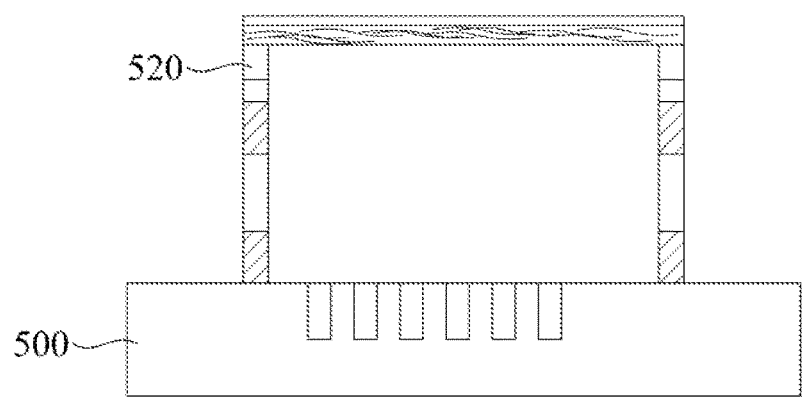

If desired, a conformal coating can be applied to the outer surface of the pellicle membrane. This is illustrated in FIGS. 11A-11D, in one embodiment. FIG. 20A shows the assembly of the border 528 and the pellicle membrane 530, which is comprised of two nanotube film layers 550, 552. The border is directly attached to the first nanotube film layer 550, which acts as the inner surface 534 of the pellicle membrane 530. The second nanotube film layer 552 acts as the outer surface 532 of the pellicle membrane 530. As seen in FIG. 11B, a coating is applied to the outer surface 532 of the pellicle membrane 530 to form the outermost layer 572. It is noted that the coating is illustrated as also being applied to the sides of the pellicle membrane, and the coating can also end up on the border 528 due to the application process. In FIG. 11C, the coated pellicle membrane 530 and border 528 are then attached to a mounting frame 522, for example through adhesive layer 529, to form a pellicle assembly 520. In FIG. 11D, the pellicle assembly 520 is mounted to the reticle 500 (having the desired mask pattern) by securing the frame to the reticle, with the pellicle membrane disposed over the mask pattern, to produce a final reticle assembly.

The conformal coating can be applied by conventional methods known in the art, such as spraying, dip coating, etc. It is desired that the conformal coating conforms to the exposed surfaces of the pellicle membrane, so that the pores which are present in the pellicle membrane remain present and are not filled by the conformal coating. Such exposed surfaces may be present in any or all of the different layers of a multi-layer pellicle membrane. In addition, the conformal coating will penetrate into the pellicle membrane, rather than being a single discrete layer upon the pellicle membrane. For example, when the conformal coating is applied to the pellicle membrane 530 having two nanotube films layers 550, 552, it is expected that the sides of some nanotubes of both layers may also be covered with the conformal coating.

When applied, the conformal coating is intended to protect the pellicle membrane from damage that can occur due to heat and hydrogen plasma created during EUV exposure. Generally, the material used for the coating should have a low refractive index, i.e. should be as close to 1 as possible when measured at a wavelength of 13.5 nm. The material used for the coating should also have a low extinction coefficient at a wavelength of 13.5 nm. The extinction coefficient measures how easily the material can be penetrated by the wavelength. Desirably, the material used for the conformal coating has a transmittance (T %), when measured at an EUV wavelength of 13.5 nm, of greater than 90%, or of greater than 92%, or of greater than 94%, or of greater than 95%, when measured at a thickness of between 1 nanometer and 10 nanometers. This reduces EUV absorption by the conformal coating (permitting further downstream processing) while protecting the pellicle membrane.

In some embodiments, the coating comprises B, BN, $B_4C$, $B_2O_3$, SiN, $Si_3N_4$, $SiN_2$, SiC, $SiC_xN_y$, Nb, NbN, NbSi, NbSiN, $Nb_2O_5$, $NbTi_xN_y$, $ZrN_x$, $ZrY_xO_y$, $ZrF_4$, YN, $Y_2O_3$, YF, Mo, $Mo_2N$, MoSi, MoSiN, Ru, RuNb, RuSiN, TiN, $TiC_xN_y$, $HfO_2$, $HfN_x$, $HfF_4$, or VN. In some embodiments, the outermost layer of the pellicle membrane has a thickness of about 1 nanometer (nm) to about 10 nm. This thickness should be measured as the thickness of the coating on the individual components of each layer in the pellicle membrane, for example the thickness of the coating on a carbon nanotube. The coating may penetrate deeper into the pellicle membrane than this thickness.

Referring now to FIG. 11B, it is noted that one significant distinction between the border 528 and the mounting frame 522 is that the mounting frame includes vent holes. These vent holes typically have very small diameters, which can be easily filled or plugged by the coating process illustrated in FIG. 11B. The use of a border 528 is more convenient for applying the conformal coating to the pellicle membrane, while also protecting the vent holes of the mounting frame. If desired, the use of the border can be omitted, with the pellicle membrane being attached directly to a mounting frame of suitable structure. For example, in some embodiments of such mounting frames, vent holes are present at the end of the mounting frame opposite the end to which the pellicle membrane is attached.

Figure 12:
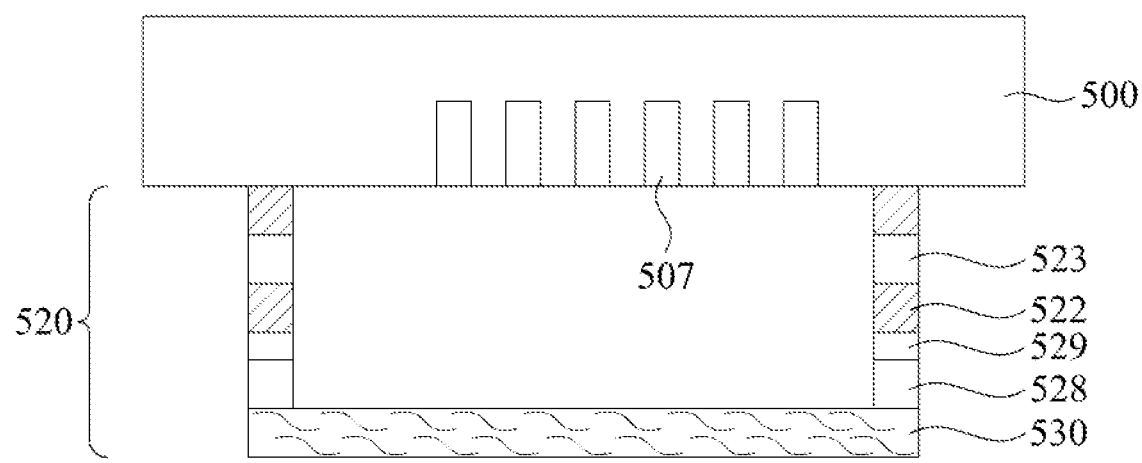
FIG. 12 is a side view of a pellicle assembly attached to an EUV reticle, in accordance with some embodiments.

FIG. 12 is a side view of a pellicle assembly attached to an EUV reticle. As illustrated here, the EUV reticle 500 includes a patterned image 507. The pellicle assembly 520 includes the pellicle membrane 530 which is attached to border 528. The border 528 may be joined to the mounting frame 522 via adhesive layer 529, or alternatively by some mechanical attachment. The adhesive layer 529 may comprise an acrylic glue. As seen here, the mounting frame 522 can include vent holes 523. The pellicle assembly 520 can be attached to the reticle 500 either by adhesive or by mechanical attachment, or by some other means.

The pellicle assembly/pellicle membrane is then used in lithographic patterning processes to produce patterned circuit layouts. In such methods, the pellicle membrane is inspected prior to use to detect the presence of any defects. This inspection may be performed as illustrated in FIG. 1 and FIG. 2. In another alternative embodiment, more generally, prior to use, an original map of the pellicle membrane has been made. The pellicle membrane is then inspected again produce an inspection map. The inspection map is compared to the original map of the pellicle membrane to identify any defects. These two maps may correspond to the first image and the second image described in FIG. 2.

Next, the pellicle membrane may be exposed to the first absorption wavelength to remove any defect that is identified during inspection. This may be done while the pellicle membrane is separated from the reticle, or while the pellicle membrane is mounted on the reticle. The pellicle membrane may subsequently be exposed to the second absorption wavelength, to promote repair of any damage caused by the defect removal and obtain a repaired pellicle membrane.

The pellicle membrane can then be used in a lithographic patterning process. The patterning process is performed on a substrate to which a photosensitive material layer has been applied. The substrate may be any type of material layer in which a pattern is desired to be formed. The photosensitive material may be, for example, photoresist. The photosensitive material may be applied, for example, by spin coating, or by spraying, roller coating, dip coating, or extrusion coating. Typically, in spin coating, the substrate is placed on a rotating platen, which may include a vacuum chuck that holds the substrate in plate. The photoresist is then applied to the center of the substrate. The speed of the rotating platen is then increased to spread the photoresist evenly from the center of the substrate to the perimeter of the substrate. The rotating speed of the platen is then fixed, which can control the thickness of the final photoresist layer. The photoresist can be baked or cured to remove the solvent and harden the photoresist layer. In some particular embodiments, the baking occurs at a temperature of about 90° C. to about 110° C. The baking can be performed using a hot plate or oven, or similar equipment.

The photosensitive material layer (e.g. photoresist) is then patterned via exposure to radiation. Referring back to the assembly of FIG. 12, an exposure wavelength is then reflected off the reticle and through the pellicle membrane. The exposure wavelength may be any light wavelength which carries a desired mask pattern. In particular embodiments, DUV light with a wavelength of 193 nm or 248 nm or EUV light having a wavelength of about 13.5 nm is used. This results in some portions of the photosensitive material layer being exposed to radiation, and some portions of the photosensitive material layer not being exposed to radiation. The reticle includes the circuit layout that is desired to be transferred.

The photosensitive material layer is then developed using a developer. The developer may be an aqueous solution or an organic solution. The soluble portions of the photosensitive material layer are dissolved and washed away during the development step, resulting in a patterned layer having the desired circuit layout. One example of a common developer is aqueous tetramethylammonium hydroxide (TMAH). Generally, any suitable developer may be used.

Continuing, portions of the substrate below the patterned layer are now exposed. The circuit layout can then be etched. This transfers the circuit layout to the substrate. The etching can be performed using wet etching, dry etching, or plasma etching processes such as reactive ion etching (RIE) or inductively coupled plasma (ICP), as appropriate. The etching may be anisotropic. Depending on the material, etchants may include carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), trifluoromethane ($CHF_3$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), oxygen ($O_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), nitrogen trifluoride ($NF_3$), or the like, or combinations thereof in various ratios.

The methods of the present disclosure thus remove catalyst particles from nanotube films which are used to make pellicle membranes. This has the advantage of increasing the strength of the nanotube film. This also simplifies inspection and certification procedures for the pellicle membrane, by removing catalyst particles which would otherwise show up in inspection images along with other contaminant particles, thus delaying or hindering identification of those contaminant particles due to the need to distinguish them from the catalyst particles (which are generally more difficult to remove).

Some embodiments of the present disclosure thus relate to methods for patterning a circuit layout. A pellicle membrane is inspected. If any defect is identified during inspection, the pellicle membrane is exposed to a first absorption wavelength to remove the defect. In a subsequent lithographic process, an exposure wavelength is reflected off a reticle and through the pellicle membrane onto a photosensitive material layer on a substrate, such as a photoresist layer. The photosensitive material layer is developed to form a patterned layer. The circuit layout is then formed by etching.

Other embodiments relate to methods for patterning a circuit layout. The pellicle membrane is inspected to produce an inspection map. The inspection map is then compared to an original map of the pellicle membrane to identify any defects. The pellicle membrane is exposed to a first absorption wavelength to remove any defects, and then exposed to a second absorption wavelength to obtain a repaired pellicle membrane. A circuit layout is then patterned using the reticle with the repaired pellicle membrane.

Some embodiments of the present disclosure thus relate to methods for removing a catalyst particle from a nanotube film used in a photolithographic patterning process. One or more catalyst particles are identified based on its/their size in the nanotube film. The catalyst particle(s) is/are then exposed to a first absorption wavelength which is selectively absorbed by the catalyst particle(s) and which heats the catalyst particle(s) to remove the catalyst particle(s) from the nanotube film.

Other embodiments of the present disclosure relate to methods for preparing a pellicle assembly from a nanotube film for use in a photolithographic patterning process. Catalyst particles in the nanotube film are exposed to a first absorption wavelength which is selectively absorbed by the catalyst particles and which heats the catalyst particles to remove the catalyst particles from the nanotube film. The thickness of the nanotube film is reduced. A pellicle membrane comprising the nanotube film is formed. The pellicle membrane is then affixed to a mounting frame to obtain the pellicle assembly.

Finally, other embodiments of the present disclosure relate to pellicle membranes for use in a photolithographic patterning process. The pellicle membranes comprise a nanotube film free from catalyst particles embedded therein, or in other words, without catalyst particles or devoid from catalyst particles. The nanotube film is produced by exposing the nanotube film to a first absorption wavelength which is selectively absorbed by catalyst particles and causes the catalyst particles to be heated and removed from the nanotube film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for patterning a circuit layout, comprising:
    inspecting a pellicle membrane and identifying catalyst particles in a nanotube film of the pellicle membrane;
    selectively exposing the catalyst particles in the pellicle membrane to a first absorption wavelength to remove the catalyst particles from the nanotube film;
    selectively exposing areas around the removed catalyst particles to a second absorption wavelength that is different from the first absorption wavelength and which is selectively absorbed by the nanotube film and promotes repair of the nanotube film;
    reflecting an exposure wavelength off a reticle and through the pellicle membrane onto a photosensitive material layer on a substrate;
    developing the photosensitive material layer to form a patterned layer; and
    forming the circuit layout by etching;
    wherein the catalyst particles are identified by:
    generating a first image in a first focal plane in a plane of the nanotube film using an inspection device;
    generating a second image in a second focal plane away from the plane of the nanotube film using the inspection device;
    processing the first image and the second image to identify the catalyst particle based on its presence in a given location in the first image and its absence from the given location in the second image.

2. The method of claim 1, wherein the difference between the first focal plane and the second focal plane is at least 0.5 micrometers.

3. The method of claim 1, wherein the inspection device is a confocal microscope.

4. The method of claim 1, wherein the second focal plane is above or below the plane of the nanotube film.

5. The method of claim 1, wherein the catalyst particles have an average particle size of at most 100 nanometers.

6. The method of claim 1, wherein the nanotube film is formed from carbon nanotubes, boron nitride nanotubes, silicon carbide nanotubes, molybdenum disulfide nanotubes, molybdenum diselenide nanotubes, tungsten disulfide nanotubes, or tungsten diselenide nanotubes.

7. The method of claim 1, wherein the first absorption wavelength is from about 300 nm to about 700 nm.

8. The method of claim 1, wherein a laser is used to expose the catalyst particles to the first absorption wavelength.

9. The method of claim 1, wherein the second absorption wavelength is from about 200 nm to about 300 nm.

10. A method for preparing a pellicle assembly from a nanotube film for use in a photolithographic patterning process, comprising:
- reducing a thickness of the nanotube film;
- identifying locations of catalyst particles in the nanotube film;
- selectively exposing the catalyst particles in the nanotube film to a first absorption wavelength to heat the catalyst particles to remove the catalyst particles from the nanotube film;
- selectively exposing areas of the nanotube film around the removed catalyst particles to a second absorption wavelength that is different from the first absorption wavelength and which is selectively absorbed by the nanotube film and promotes repair of the nanotube film;
- forming a pellicle membrane comprising the nanotube film; and
- affixing the pellicle membrane to a mounting frame to obtain the pellicle assembly.

11. The method of claim 10, wherein the first absorption wavelength is from about 300 nm to about 700 nm.

12. The method of claim 10, further comprising removing contaminant particles from the nanotube film.

13. The method of claim 10, wherein a conformal coating is applied to at least an outer surface of the pellicle membrane.

14. The method of claim 10, wherein the second absorption wavelength is from about 200 nm to about 300 nm.

15. The method of claim 10, wherein the nanotube film is formed from carbon nanotubes, boron nitride nanotubes, silicon carbide nanotubes, molybdenum disulfide nanotubes, molybdenum diselenide nanotubes, tungsten disulfide nanotubes, or tungsten diselenide nanotubes.

16. A method for patterning a circuit layout, comprising:
- inspecting a pellicle membrane to produce an inspection map;
- comparing the inspection map to an original map of the pellicle membrane to identify locations of catalyst particles in a nanotube film in the pellicle membrane;
- selectively exposing the catalyst particles in the pellicle membrane to a first absorption wavelength to remove the catalyst particles from the nanotube film;
- selectively exposing areas of the pellicle membrane around the removed catalyst particles to a second absorption wavelength that is different from the first absorption wavelength to promote repair of the nanotube film and obtain a repaired pellicle membrane; and
- patterning a circuit layout using a reticle with the repaired pellicle membrane.

17. The method of claim 16, wherein the nanotube film is formed from nanotubes comprising carbon, boron nitride, silicon carbide, molybdenum disulfide, molybdenum diselenide, tungsten disulfide, or tungsten diselenide.

18. The method of claim 16, wherein the second absorption wavelength is from about 200 nm to about 300 nm.

19. The method of claim 16, wherein the first absorption wavelength is from about 300 nm to about 700 nm.

20. The method of claim 16, wherein a laser is used to expose the catalyst particles to the first absorption wavelength.

* * * * *